(12) United States Patent
Ito et al.

(10) Patent No.: US 12,512,335 B2
(45) Date of Patent: Dec. 30, 2025

(54) SUBSTRATE PROCESSING APPARATUS, SUBSTRATE PROCESSING METHOD, AND METHOD OF MANUFACTURING SEMICONDUCTOR DEVICE

(71) Applicant: Kioxia Corporation, Tokyo (JP)

(72) Inventors: Fuyuma Ito, Mie (JP); Jun Takagi, Mie (JP); Ai Mori, Mie (JP); Yosuke Maruyama, Mie (JP); Yuya Akeboshi, Mie (JP); Takashi Watanabe, Mie (JP); Hiroyasu Iimori, Aichi (JP)

(73) Assignee: KIOXIA CORPORATION, Tokyo (JP)

( * ) Notice: Subject to any disclaimer, the term of this patent is extended or adjusted under 35 U.S.C. 154(b) by 217 days.

(21) Appl. No.: 18/456,652

(22) Filed: Aug. 28, 2023

(65) Prior Publication Data

US 2024/0096659 A1 Mar. 21, 2024

(30) Foreign Application Priority Data

Sep. 21, 2022 (JP) ................................ 2022-150124

(51) Int. Cl.
*H01L 21/67* (2006.01)
*H01L 21/311* (2006.01)
*H01L 21/3213* (2006.01)

(52) U.S. Cl.
CPC .. *H01L 21/67086* (2013.01); *H01L 21/31111* (2013.01); *H01L 21/32134* (2013.01); *H01L 21/67051* (2013.01)

(58) Field of Classification Search
USPC .................................................... 156/345.17
See application file for complete search history.

(56) References Cited

U.S. PATENT DOCUMENTS 5,032,217 A 7/1991 Tanaka
5,456,788 A * 10/1995 Barbee .............. H01L 21/32135
156/345.16

(Continued)

FOREIGN PATENT DOCUMENTS

JP H06-103687 B2 12/1994
JP H11-354482 A 12/1999

(Continued)

*Primary Examiner* — Shamim Ahmed
(74) *Attorney, Agent, or Firm* — Foley & Lardner LLP

(57) ABSTRACT

A substrate processing apparatus includes: a plurality of roller pairs configured to place a plurality of substrates, respectively, wherein the substrates are arranged side by side in a horizontal direction with a predetermined interval, and rotate the plurality of substrates, respectively, in a circumferential direction; a first, second, and third circulation groove that are disposed along outer peripheral portions of each of the plurality of substrates; a chemical solution supplier configured to supply a chemical solution to the outer peripheral portions of the plurality of substrates through the first circulation groove; a rinse solution supplier configured to supply a rinse solution to the outer peripheral portions of the plurality of substrates through the second circulation groove; and a fluid supplier configured to supply a fluid for drying the rinse solution to the outer peripheral portions of the plurality of substrates through the third circulation groove.

5 Claims, 8 Drawing Sheets

(56) References Cited

U.S. PATENT DOCUMENTS

| | | | |
|---|---|---|---|
| 6,797,074 B2 | 9/2004 | Redeker et al. | |
| 2006/0185792 A1* | 8/2006 | Yashiki | H01L 21/67259 |
| | | | 216/84 |
| 2015/0318192 A1* | 11/2015 | Ito | H01L 21/6708 |
| | | | 156/345.21 |
| 2016/0071746 A1* | 3/2016 | Hayashi | B05D 1/005 |
| | | | 156/345.17 |

FOREIGN PATENT DOCUMENTS

| JP | 2002-231690 A | 8/2002 |
|---|---|---|
| JP | 2003-197592 A | 7/2003 |
| JP | 4709346 B2 | 6/2011 |

\* cited by examiner

*FIG. 6A* *FIG. 6B* *FIG. 6C*
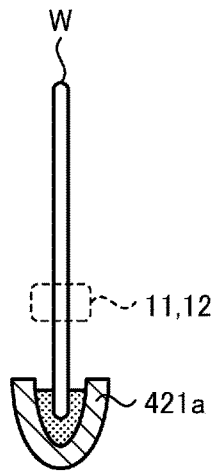
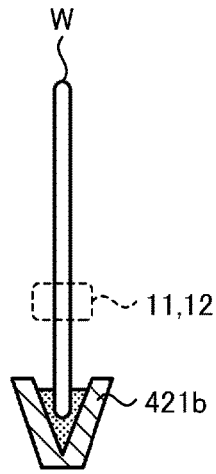
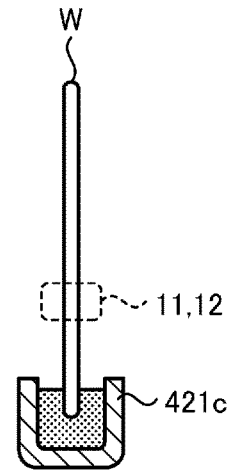
*FIG. 7*
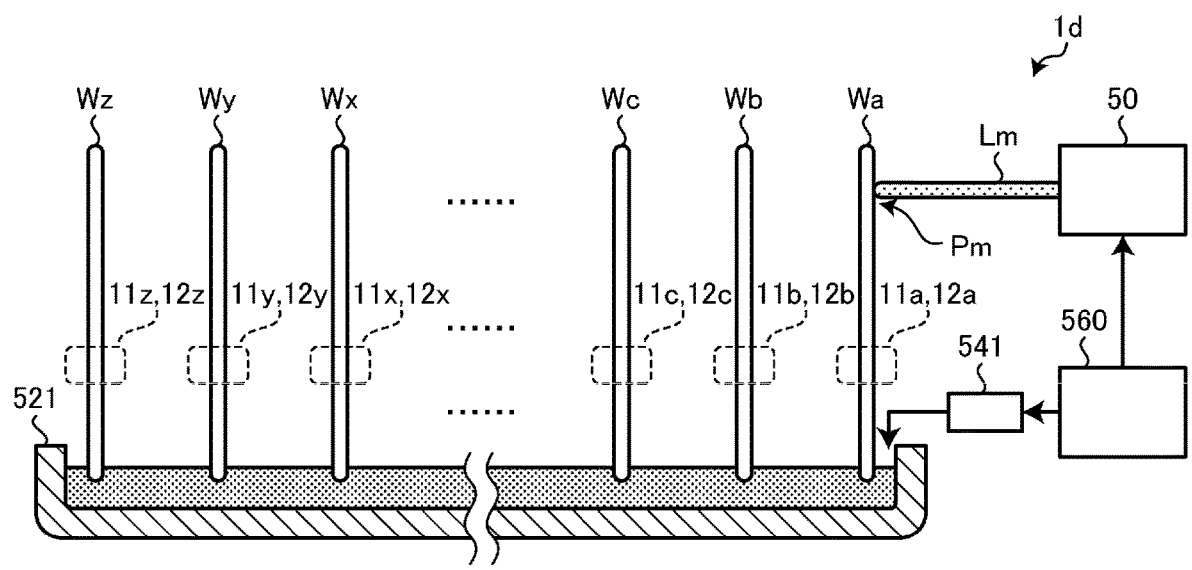

SUBSTRATE PROCESSING APPARATUS, SUBSTRATE PROCESSING METHOD, AND METHOD OF MANUFACTURING SEMICONDUCTOR DEVICE

CROSS-REFERENCE TO RELATED APPLICATION

This application is based upon and claims the benefit of priority from Japanese Patent Application No. 2022-150124, filed Sep. 21, 2022, the entire contents of which are incorporated herein by reference.

FIELD

Embodiments described herein relate generally to a substrate processing apparatus, a substrate processing method, and a method of manufacturing a semiconductor device.

BACKGROUND

In manufacturing a semiconductor device, a substrate processing apparatus for processing the outer peripheral portion of a substrate with a chemical solution is used. In such a substrate processing apparatus, it is common to hold the substrate horizontally during processing. However, when the substrate is held horizontally and processed, it is difficult to reduce the installation area of the substrate processing apparatus.

DESCRIPTION OF THE DRAWINGS

FIGS. 6A to 6C are schematic diagrams showing an example of a configuration of a substrate processing apparatus according to a third modification of the first embodiment.

FIG. 7 is a schematic diagram showing an example of a configuration of a substrate processing apparatus according to a fourth modification of the first embodiment.

DETAILED DESCRIPTION

Embodiments provide a substrate processing apparatus, a substrate processing method, and a method of manufacturing a semiconductor device capable of reducing the installation area.

In general, according to one embodiment, a substrate processing apparatus includes: a plurality of roller pairs configured to place a plurality of substrates, respectively, wherein the substrates are arranged side by side in a horizontal direction with a predetermined interval, and rotate the plurality of substrates, respectively, in a circumferential direction; a first circulation groove, a second circulation groove, and a third circulation groove that are disposed along outer peripheral portions of each of the plurality of substrates; a chemical solution supplier configured to supply a chemical solution to the outer peripheral portions of the plurality of substrates through the first circulation groove; a rinse solution supplier configured to supply a rinse solution to the outer peripheral portions of the plurality of substrates through the second circulation groove; and a fluid supplier configured to supply a fluid for drying the rinse solution to the outer peripheral portions of the plurality of substrates through the third circulation groove.

Hereinafter, embodiments will be described in detail with reference to the accompanying drawings. In addition, the present disclosure is not limited by the following embodiments. Further, components in the following embodiments include components that can be easily assumed by those skilled in the art or substantially the same components.

First Embodiment

Hereinafter, a first embodiment will be described in detail with reference to the drawings.

Configuration Example of Substrate Processing Apparatus

Figure 1A:
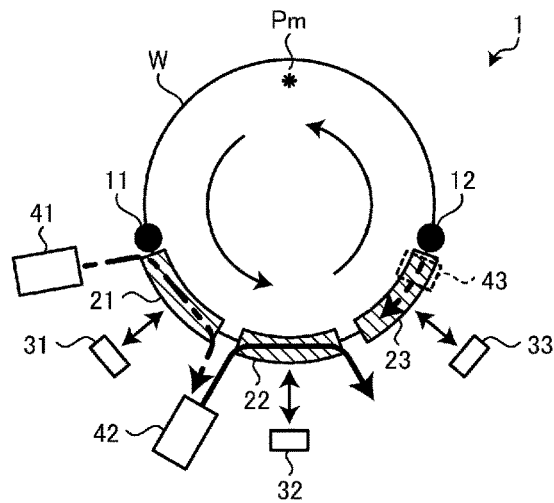
FIGS. 1A to 1C are schematic diagrams showing an example of a configuration of a substrate processing apparatus according to a first embodiment.
Figure 1B:
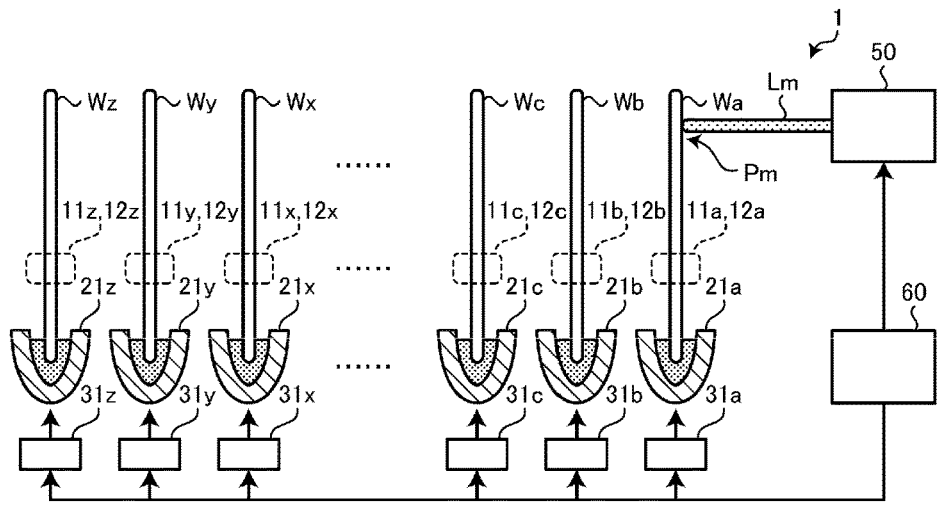
Figure 1C:
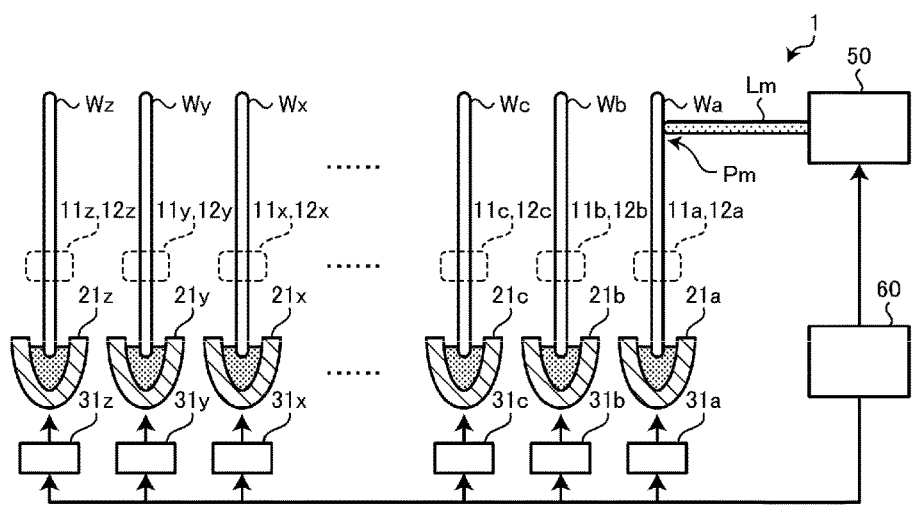

FIGS. 1A to 1C are schematic diagrams showing an example of a configuration of a substrate processing apparatus 1 according to the first embodiment. FIG. 1A is a front view of an inside of a processing chamber of the substrate processing apparatus 1. FIGS. 1B and 1C are side views of the inside of the processing chamber of the substrate processing apparatus 1.

The substrate processing apparatus 1 according to the first embodiment is configured as a semiconductor manufacturing apparatus that processes, for example, a plurality of substrates W with a chemical solution. Thus, an edge cutting process is performed to remove a predetermined film such as an insulating film or a metal film (not shown) formed on an outer peripheral portion of each of the substrates W.

As shown in FIGS. 1A to 1C, the substrate processing apparatus 1 according to the first embodiment includes rollers 11 and 12, circulation grooves 21, 22, and 23, driving units 31, 32, and 33, a chemical solution supply unit (or chemical solution supplier) 41, a rinse solution supply unit (or rinse solution supplier) 42, a fluid supply unit (or fluid supplier) 43, a film thickness meter 50, and a control unit (or controller) 60.

Among these components, the rollers 11 and 12, the circulation grooves 21, 22, and 23, the driving units 31, 32, and 33, the chemical solution supply unit 41, the rinse solution supply unit 42, and the fluid supply unit 43 are provided for each individual substrate W.

That is, the plurality of rollers 11 and 12 are provided corresponding to the plurality of substrates W, respectively, and hold the plurality of vertically erected substrates W (Wa, Wb, Wc, . . . ) side by side in a horizontal direction at predetermined intervals. More specifically, the plurality of substrates W are located in the horizontal direction with surfaces on which the predetermined films are formed facing the same direction. These substrates W are at the same manufacturing stage, and are of the same lot having the same configuration or a plurality of lots.

For example, predetermined rollers 11 and 12 support at least two points on the outer peripheral portion on lower side of the vertically erected substrate W, corresponding to these rollers 11 and 12. These rollers 11 and 12 are rotatable by a driving unit (not shown), and rotate the supported substrate W in a circumferential direction. The rotational speed of the substrate W can be, for example, 1,000 rotations per minute (rpm).

As shown in FIG. 1A, on the lower side of the substrate W held by the rollers 11 and 12, the circulation grooves 21 to 23 are provided in order from an upstream side in a rotation direction of the substrate W. These circulation grooves 21 to 23 are, for example, arc-shaped along the outer peripheral portion of the substrate W, and are open toward the substrate W at the top and closed at the bottom. A liquid such as a chemical solution or a gas such as dry air may circulate in the circulation grooves 21 to 23.

Since the circulation grooves 21 to 23 are disposed along the outer peripheral portion of the substrate W from the upstream side in the rotation direction of the substrate W, the outer peripheral portion of the substrate W rotated by the rollers 11 and 12 is configured to pass through the circulation grooves 21 to 23 sequentially. Thus, the outer peripheral portion of the substrate W is sequentially processed with the liquid or gas circulating through the circulation grooves 21 to 23.

The chemical solution supply unit 41 that supplies the chemical solution is provided in the circulation groove 21 as a first circulation groove. The chemical solution supply unit 41 circulates the chemical solution from the upstream side to the downstream side of the circulation groove 21. The chemical solution reaching a downstream end of the circulation groove 21 is discharged out of the circulation groove 21 from the downstream end of the circulation groove 21. In addition, the chemical solution discharged from the circulation groove 21 may be circulated to the circulation groove 21 again and used repeatedly.

The chemical solution supplied to the circulation groove 21 by the chemical solution supply unit 41 is a removal liquid or the like for removing the predetermined film formed on the outer peripheral portion of the substrate W. When the predetermined film is an insulating layer such as a silicon oxide layer or a silicon nitride layer, for example, hydrofluoric acid (HF aqueous solution) or the like may be used as the chemical solution. When the predetermined film is a metal-containing layer such as a tungsten layer or a tungsten nitride layer, as the chemical solution, for example, a hydrogen peroxide solution ($H_2O_2$ aqueous solution), or a mixed solution of the hydrogen peroxide solution and organic alkali such as a choline solution may be used.

The rinse solution supply unit 42 that supplies a rinse solution is provided in the circulation groove 22 as a second circulation groove.

The rinse solution supply unit 42 circulates the rinse solution from the upstream side to the downstream side of the circulation groove 22. The rinse solution reaching a downstream end of the circulation groove 22 is discharged out of the circulation groove 22 from the downstream end of the circulation groove 22. Here, it is preferable that a supply position of the rinse solution is closer to an inner side of the substrate W than a supply position of the chemical solution. Further, the rinse solution discharged from the circulation groove 22 may be circulated to the circulation groove 22 again and used repeatedly.

The rinse solution supplied to the circulation groove 22 by the rinse solution supply unit 42 is a liquid that cleans the outer peripheral portion of the substrate W processed with the chemical solution, and is, for example, pure water or deionized water (DIW).

The fluid supply unit 43 that supplies a dry fluid is provided in the circulation groove 23 as a third circulation groove. The fluid supply unit 43 circulates the dry fluid from the downstream side to the upstream side of the circulation groove 23. The dry fluid reaching an upstream end of the circulation groove 23 is discharged out of the circulation groove 23 from the upstream end of the circulation groove 23. In addition, the dry fluid discharged from the circulation groove 23 may be circulated to the circulation groove 23 again and used repeatedly.

The dry fluid supplied to the circulation groove 23 by the fluid supply unit 43 is a liquid or gas that dries the outer peripheral portion of the substrate W cleaned with the rinse solution, and is, for example, heated dry air ($N_2$) or isopropyl alcohol (IPA).

Further, the driving units 31 to 33 are provided in these circulation grooves 21 to 23, respectively. These driving units 31 to 33 are capable of driving the circulation grooves 21 to 23 in a radial direction of the substrate W, respectively. By moving these circulation grooves 21 to 23 away from the substrate W in the radial direction, a width of the outer peripheral portion of the substrate W to be processed with the chemical solution or the like is narrowed. By bringing these circulation grooves 21 to 23 closer to the substrate W in the radial direction, the width of the outer peripheral portion of the substrate W to be processed with the chemical solution or the like is increased. This state is shown in FIGS. 1B and 1C.

FIGS. 1B and 1C show the state in which the rollers 11 (11a, 11b, 11c, . . . ) and 12 (12a, 12b, 12c, . . . ), the circulation groove 21 (21a, 21b, 21c, . . . ), and the driving unit 31 (31a, 31b, 31c, . . . ) are respectively provided for each substrate W.

In addition, FIGS. 1B and 1C show, as representatives, the circulation groove 21 and the driving unit 31 provided for each substrate W, among the circulation grooves 21 to 23 and the driving units 31 to 33. However, as described above, the circulation grooves 22 and 23, the driving units 32 and 33, the chemical solution supply unit 41, the rinse solution supply unit 42, and the fluid supply unit 43, which are not shown in FIGS. 1B and 1C, are also provided corresponding to the plurality of substrates W, respectively.

In the example shown in FIG. 1B, the driving units 31 provided corresponding to the respective circulation grooves 21 are driven in the direction approaching the substrate W in the radial direction under control by the control unit 60.

Thus, an amount of sinking of the outer peripheral portion of each substrate W into the chemical solution circulated in each of the circulation grooves 21 increases, and the outer peripheral portion of the substrate W is processed with a wider width.

In the example shown in FIG. 1C, the driving units 31 provided corresponding to the respective circulation grooves 21 are driven in the direction away from the substrate W in the radial direction under the control by the control unit 60. Thus, the amount of sinking of the outer peripheral portion of each substrate W into the chemical solution circulated in each of the circulation grooves 21 decreases, and the outer peripheral portion of the substrate W is processed with a narrower width.

The film thickness meter 50 is configured with an optical sensor or the like that measures a film thickness of the predetermined film formed on the outer peripheral portion of the substrate W by irradiation with electromagnetic waves Lm such as X-rays. The plurality of substrates W are located with the surfaces on which the predetermined films are formed facing the same direction. The film thickness meter 50 irradiates a measurement point Pm on the outer peripheral portion on an upper side of the first vertically erected substrate W with the electromagnetic waves Lm, with the direction in which the surfaces of the plurality of substrates W on which the predetermined film is formed face as the front. Thus, the film thickness meter 50 measures the film thickness of the predetermined film formed on the outer peripheral portion of the first substrate W.

However, the film thickness meter 50 may measure the film thickness at any position on the outer peripheral portion of the substrate W passing between the downstream end of the circulation groove 23 and an upstream end of the circulation groove 21. Since the outer peripheral portion of the substrate W is in a dry state between the circulation groove 23 and the circulation groove 21, the film thickness of the predetermined film can be measured with high precision without being disturbed by droplets of the chemical solution or the rinse solution.

In other words, the substrate W only needs to be in a dry state so that the film thickness meter 50 can obtain sufficient measurement accuracy. Therefore, the cleaning of the substrate W with the rinse solution and the drying with the dry fluid, which are performed while the substrate W rotates once, may not be complete.

In addition, the predetermined film may be formed on the outer peripheral portions of both front and rear surfaces of the substrate W. In this case, generally, the predetermined film on the front surface of the substrate W, that is, the surface of the substrate W on which the semiconductor device is provided is subjected to chemical solution processing. On the other hand, the predetermined film on the rear surface of the substrate W, that is, the surface opposite to the surface on which the semiconductor device is provided, may be subject to the chemical solution processing. Further, in some cases, the predetermined films on both the front and rear surfaces of the substrate W are subject to the chemical solution processing.

The plurality of substrates W can be held by the rollers 11 and 12, with the surfaces to be processed facing the film thickness meter 50 side, among the front and rear surfaces of the substrates W. Further, when both the front and rear surfaces of the substrate W are to be processed, the surface requiring more precise processing can be directed toward the film thickness meter 50 side.

The control unit 60 is a computer unit including, for example, a central processing unit (CPU), a read only memory (ROM), a random access memory (RAM), or the like, and controls each unit of the substrate processing apparatus 1.

That is, while controlling, for example, the rollers 11 and 12 to rotate the substrate W, the control unit 60 controls the chemical solution supply unit 41, the rinse solution supply unit 42, and the fluid supply unit 43 to respectively circulate the chemical solution, the rinse solution, and the dry fluid to the circulation grooves 21 to 23, so that the outer peripheral portion of the substrate W is processed.

Further, the control unit 60 controls the film thickness meter 50 to measure the film thickness of the predetermined film on the outer peripheral portion of the substrate W, and performs various controls based on measurement result. At this time, among the plurality of substrates W processed by the substrate processing apparatus 1 at once, the film thickness of only the first substrate W is measured by the film thickness meter 50. However, as described above, these substrates W have the same configuration at the same manufacturing stage. Therefore, for example, the film thickness of the first substrate W may be used as representative data of these substrates W, and various processes described below may be performed.

Specifically, the control unit 60 controls the driving units 31 to 33 based on the measurement result of the film thickness meter 50 to adjust positions of the circulation grooves 21 to 23 in the radial direction of the substrate W. More specifically, the control unit 60 adjusts the positions of the circulation grooves 21 to 23 with respect to the substrate W according to the width of the predetermined film of the substrate W. Further, when the predetermined film formed in a ring shape on the outer peripheral portion of the substrate W is eccentric with respect to a center position of the substrate W, the control unit 60 appropriately changes the positions of the circulation grooves 21 to 23 with respect to the substrate W each time the substrate W rotates, and changes a processing width according to the position of the outer peripheral portion of the substrate W.

Further, based on the measurement result of the film thickness meter 50, the control unit 60 calculates the timing at which a desired amount of the predetermined film on the outer peripheral portion of the substrate W is removed, and determines the timing when processing of the substrate W is ended. At this time, the control unit 60 may determine the processing time before starting the processing, based on the film thickness measurement result of the predetermined film before the chemical solution processing.

Alternatively, the control unit 60 may monitor the film thickness of the predetermined film during the chemical solution processing, and may end the processing of the substrate W, for example, when detecting that the predetermined film is sufficiently removed. Alternatively, the control unit 60 may monitor the film thickness of the predetermined film during the chemical solution processing, and end the processing of the substrate W, for example, when detecting that the base of the predetermined film is exposed.

Method of Manufacturing Semiconductor Device

Figure 2A:
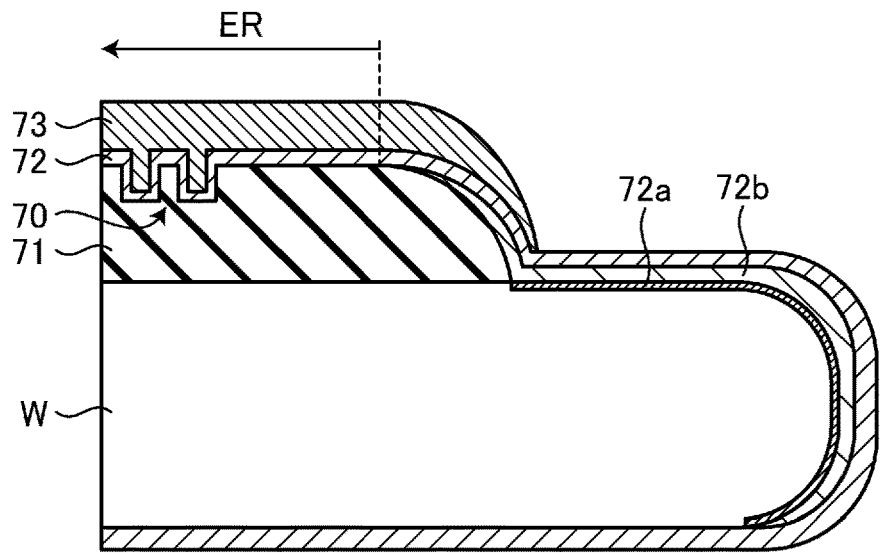
FIGS. 2A to 2C are cross-sectional views of a substrate illustrating a part of a procedure of a method of manufacturing a semiconductor device according to the first embodiment.
Figure 2B:
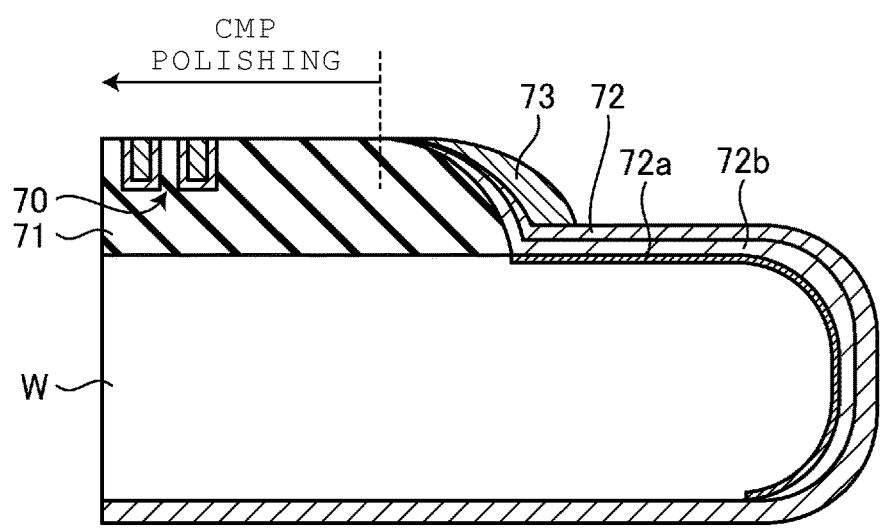
Figure 2C:
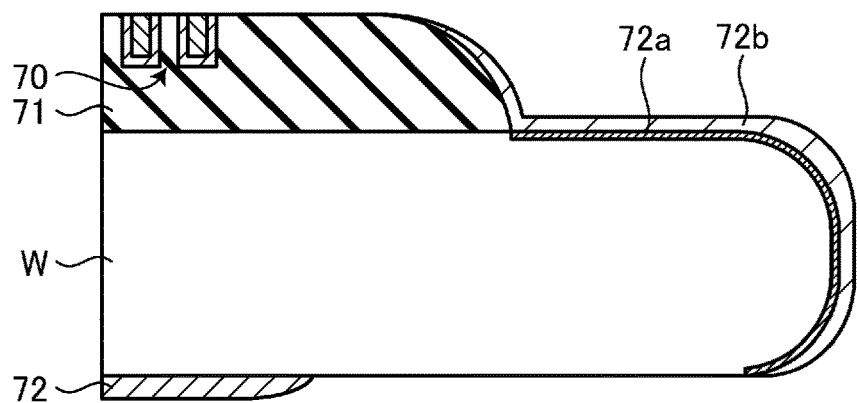

Next, an example of a method of manufacturing a semiconductor device 70 according to the first embodiment will be described with reference to FIGS. 2A to 2C. FIGS. 2A to 2C are cross-sectional views of the substrate W illustrating a part of a procedure of the method of manufacturing the semiconductor device 70 according to the first embodiment.

The semiconductor device 70 is manufactured on the substrate W through a plurality of processes. Therefore, depending on the manufacturing stage of the semiconductor device 70, the chemical solution processing by the above-described substrate processing apparatus 1 is repeatedly performed, and the film type of the predetermined film to be processed may differ as appropriate. FIGS. 2A to 2C show the semiconductor device 70 in the process of being manufactured, and is an example in which the predetermined film to be processed is a metal film.

As shown in FIG. 2A, the semiconductor device 70 includes an insulating film 71 formed on the substrate W such as a silicon substrate, a titanium nitride film 72 formed on the insulating film 71, and a tungsten film 73 formed on the titanium nitride film 72, at the manufacturing stage shown in FIG. 2A.

More specifically, the insulating film 71 is formed on the front surface of the substrate W excluding the outer peripheral portion. For example, a plug or the like having a liner of the titanium nitride film 72 and a core of the tungsten film 73 is formed in the insulating film 71. In this manner, the semiconductor device 70 is manufactured within an element region ER in which the insulating film 71 is formed, excluding the outer peripheral portion of the substrate W, for example.

The titanium nitride film 72 is also formed on the upper surface of the insulating film 71, the outer peripheral portion of the substrate W, and the rear surface of the substrate W. Here, the titanium nitride film 72 is formed by, for example, nitriding the titanium film 72b that is a seed film. Therefore, the titanium film 72b that is not subjected to the nitriding process may remain under the titanium nitride film 72 at the outer peripheral portion and the bevel of the substrate W which are outside the element region ER and are not subjected to various processes. Further, a part of the remaining titanium film 72b may be combined with silicon or the like of the substrate W, which is the base, to form a titanium silicide film 72a.

The tungsten film 73 is also formed in a region on the surface of the substrate W excluding the outer peripheral portion, which substantially overlaps with the formation region of the insulating film 71.

The titanium nitride film 72 and the tungsten film 73 which are formed on the insulating film 71 and in an outer region of the insulating film 71 are unnecessary portions and are therefore to be removed.

As shown in FIG. 2B, the titanium nitride film 72 and the tungsten film 73 on the insulating film 71 are removed by, for example, a chemical mechanical polishing (CMP) process. However, the titanium nitride film 72 and the tungsten film 73 formed in the outer region of the insulating film 71 still remain after the CMP process. Therefore, the outer peripheral portion of the substrate W is processed with the chemical solution, for example, by the substrate processing apparatus 1 described above.

That is, the plurality of vertically erected substrates W are located in the horizontal direction and held by the plurality of rollers 11 and 12 of the substrate processing apparatus 1 at predetermined intervals. Further, the control unit 60 controls the plurality of rollers 11 and 12 to rotate the substrates W held by these rollers 11 and 12. Further, the control unit 60 controls the chemical solution supply unit 41, the rinse solution supply unit 42, and the fluid supply unit 43 to circulate the chemical solution, the rinse solution, and the dry fluid in the circulation grooves 21 to 23, respectively. At this time, as described above, the chemical solution, the rinse solution, and the dry fluid may be controlled to repeatedly circulate in the circulation grooves 21 to 23.

The outer peripheral portions of the plurality of substrates W are sequentially immersed in the chemical solution in the circulation groove 21 and the rinse solution in the circulation groove 22, and further exposed to the dry fluid in the circulation groove 23. Thus, the tungsten film 73 and the titanium nitride film 72 as the predetermined films formed on the outer peripheral portion of the plurality of substrates W are processed with the chemical solution. Further, the outer peripheral portions of the plurality of substrates W after chemical solution processing are cleaned with the rinse solution. At this time, as described above, it is preferable that the supply position of the rinse solution is closer to the inner side of the substrate W than the supply position of the chemical solution. Further, the outer peripheral portions of the plurality of substrates W after cleaning are dried with the dry fluid.

As the substrates W rotate in the circumferential direction, the tungsten films 73 and the titanium nitride films 74 on the outer peripheral portions of the plurality of substrates W are repeatedly processed with the chemical solution, and the film thicknesses of these films gradually decrease.

Meanwhile, the control unit 60 acquires the measurement result from the film thickness meter 50 at least before the chemical solution processing. Thus, data on the film thicknesses of the tungsten film 73 and the titanium nitride film 74 before chemical solution processing is obtained. The control unit 60 can determine the chemical solution processing time for the outer peripheral portion of the substrate W from these film thicknesses.

Alternatively, in addition to or instead of the measurement result before the chemical solution processing, the control unit 60 may continuously acquire the measurement result from the film thickness meter 50 during the chemical solution processing, and monitor the film thickness of the tungsten film 73 and the titanium nitride film 74.

In this case, the control unit 60 can end the chemical solution processing, with the timing when the tungsten film 73 and the titanium nitride film 74 disappear as the end point, from the film thicknesses in real-time of the tungsten film 73 and the titanium nitride film 74. The control unit 60 may end the chemical solution processing, with the detection timing of the exposure of the titanium film 72b as the end point, when detecting that the titanium film 72b, which is the base of the tungsten film 73 and the titanium nitride film 74, is exposed.

As shown in FIG. 2C, the tungsten film 73 and the titanium nitride film 74 are removed from the outer peripheral portion of the substrate W by the above-described processing by the substrate processing apparatus 1.

In addition, the substrate W may not be completely cleaned with the rinse solution and dried with the dry fluid when the processing by the substrate processing apparatus 1 is ended. A small amount of the chemical solution or the rinse solution may remain on the substrate W as long as the chemical solution is removed to such an extent that the substrate W is not further processed by the chemical solution. In such a case, after the substrate W is carried out of the substrate processing apparatus 1, the cleaning and drying of the substrate W may be completed by another cleaning device or the like.

After that, the semiconductor device 70 of the first embodiment is manufactured by performing various processes.

Overview

A semiconductor device is manufactured by repeating a plurality of processes including a film formation process and an etching process. At this time, the predetermined film formed outside the element region is appropriately removed to maintain the flatness of the front surface of the substrate W and to prevent particles from being generated.

When removing the predetermined film on the outer peripheral portion of the substrate, the substrate held horizontally is usually rotated to supply the chemical solution to the outer peripheral portion of the substrate. Thus, the chemical solution scatters to the outside of the substrate due to the rotation of the substrate, so that the spread of the chemical solution toward the center side of the substrate can be prevented, and the outer peripheral portion of the substrate can be processed with a desired width.

However, it is difficult to reduce the ground area, in a substrate processing apparatus that horizontally holds a substrate.

Further, a single-wafer configuration for processing the substrates one by one is inevitably adopted, and it is difficult to adopt a batch-type device configuration for processing a plurality of substrates at once. Therefore, the productivity of the substrate processing apparatus is lowered.

Further, when removing the predetermined film on the outer peripheral portion of the substrate, considering the film thickness difference of the predetermined film in the substrate and between the substrates, the processing is performed by taking extra processing time with respect to the target film thickness not to leave a film residue. This also reduces the productivity of the substrate processing apparatus and increases a consumption amount of the chemical solution.

In the substrate processing apparatus 1 according to the first embodiment, the plurality of vertically erected substrates W are rotated while being located in the horizontal direction and held at predetermined intervals, and the chemical solution, the rinse solution, and the dry fluid are respectively circulated in the circulation grooves 21 to 23 disposed along the outer peripheral portions of the plurality of substrates W in order from the upstream side in the rotation direction of the substrate W, on the lower side of the plurality of substrates W.

Thus, the installation area of the substrate processing apparatus 1 can be reduced. Further, the batch-type substrate processing apparatus 1 can be easily configured, and the productivity can be improved. Further, for example, the removal of the predetermined film with the chemical solution, and the cleaning and drying of the outer peripheral portion of the substrate W can be collectively performed by one substrate processing apparatus 1, so that it is also possible to improve the productivity.

In the substrate processing apparatus 1 according to the first embodiment, the film thickness of the predetermined film on the upper side of the first substrate W among the plurality of substrates W is measured, with the direction in which the surfaces of the plurality of substrates W on which the predetermined film is formed face as the front. As described above, by processing the substrate W while being vertically erected, it is possible to clearly separate a portion to be processed with the chemical solution and a dry portion, in one substrate W, and the film thickness measurement in the dry portion becomes possible. Further, since the film thickness can be measured without being disturbed by water droplets or the like, the film thickness data can be obtained with high accuracy.

Accordingly, it is possible to determine the processing time with the chemical solution, based on the film thickness of the predetermined film. Therefore, the productivity of the substrate processing apparatus 1 can be improved, and the consumption amount of the chemical solution can be reduced.

In the substrate processing apparatus 1 according to the first embodiment, the positions of the circulation grooves 21 to 23 in the radial direction of the plurality of substrates W may be changed, with respect to the plurality of substrates W. Thus, the processing width of the outer peripheral portion of the substrate W can be precisely controlled by changing a height of a liquid level of the chemical solution with respect to the substrate W. Further, when the predetermined film formed in a ring shape on the outer peripheral portion of the substrate W is eccentric with respect to the center position of the substrate W, the processing width may be changed for each position of the outer peripheral portion of the substrate W.

First Modification

Next, an example of a configuration of a substrate processing apparatus 1a according to a first modification of the first embodiment will be described with reference to FIGS. 3A and 3B. The substrate processing apparatus 1a according to the first modification is different from the above-described first embodiment in that a processing width of an outer peripheral portion of the substrate W is adjusted by changing a supply amount of a chemical solution.

Figure 3A:
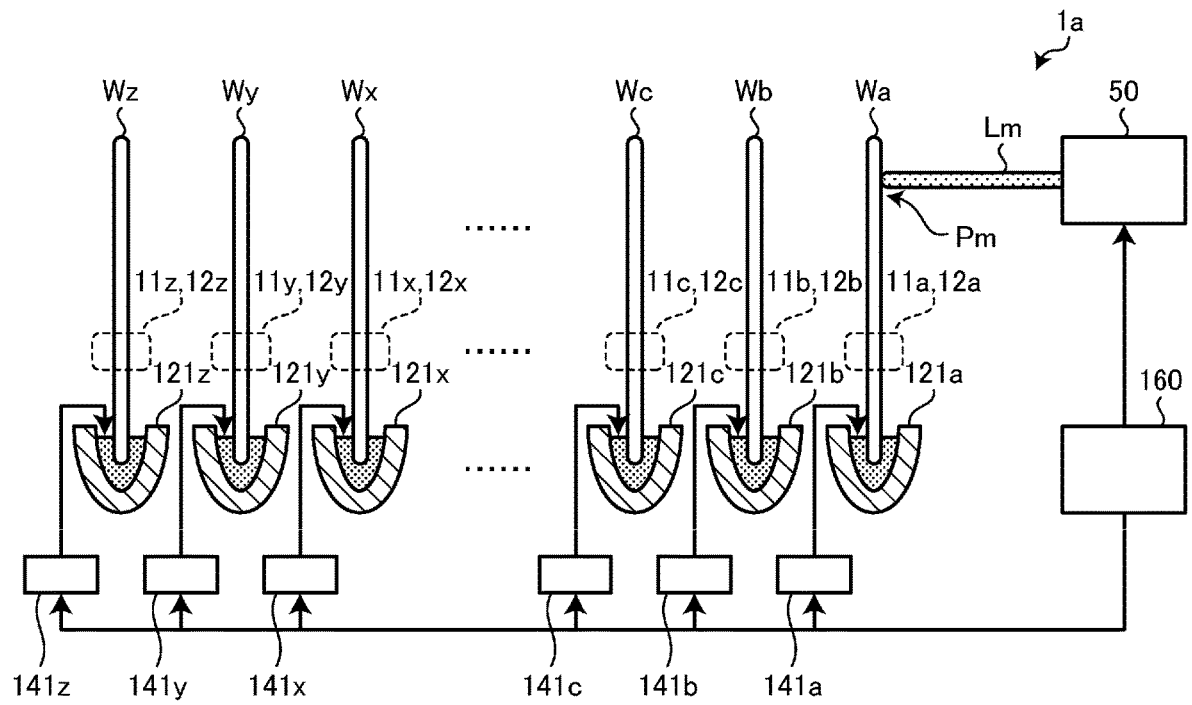
FIGS. 3A and 3B are schematic diagrams showing an example of a configuration of a substrate processing apparatus according to a first modification of the first embodiment.
Figure 3B:
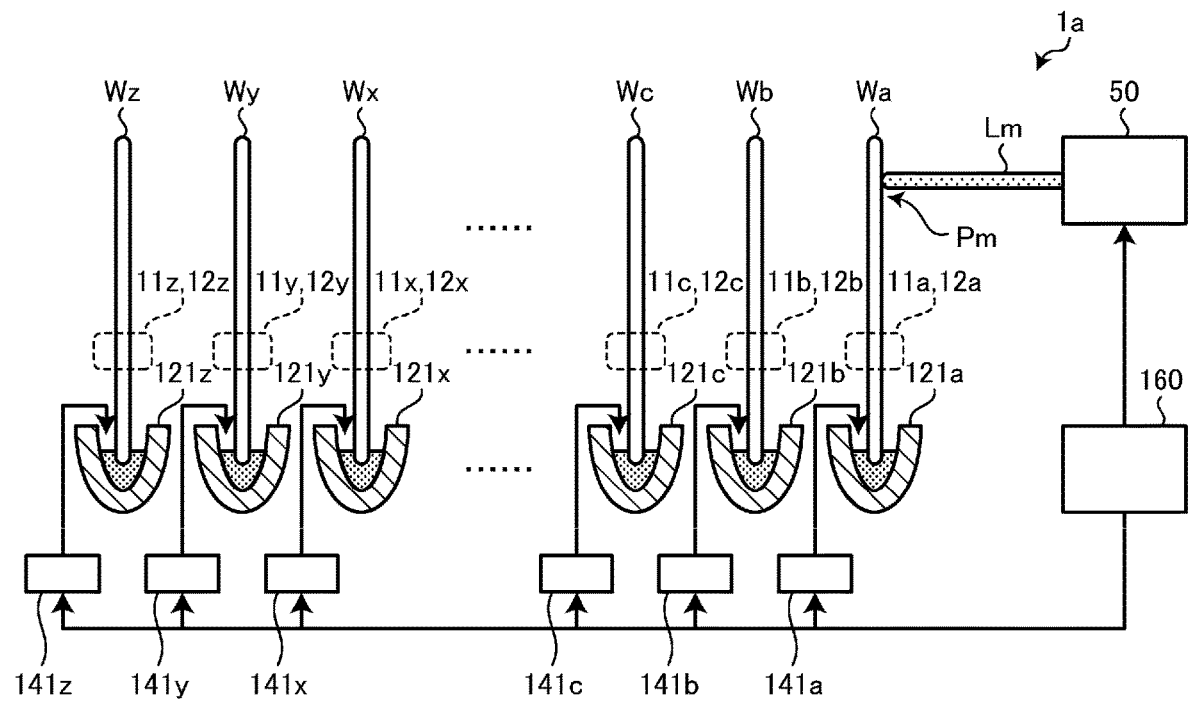

FIGS. 3A and 3B are schematic diagrams showing the example of the configuration of the substrate processing apparatus 1a according to the first modification of the first embodiment. In addition, in FIGS. 3A and 3B, the same reference numerals are assigned to the same components as in the above-described first embodiment, and the description thereof may be omitted.

As shown in FIGS. 3A and 3B, the substrate processing apparatus 1a includes a plurality of circulation grooves 121 (121a, 121b, 121c, that correspond to a plurality of substrates W (Wa, Wb, Wc, respectively and are provided with chemical solution supply units 141 (141a, 141b, 141c, respectively.

The chemical solution supply unit 141 provided in the circulation groove 121 is configured to be able to change the supply amount of the chemical solution to be circulated in the circulation groove 121 under the control of the control unit 160. The control unit 160 controls the chemical solution supply unit 141 based on, for example, the film thickness measurement result of the film thickness meter 50 to change the supply amount of the chemical solution to the circulation groove 121. Thus, the height of the liquid level of the chemical solution in the circulation groove 121 is changed, and the processing width of the outer peripheral portion of the substrate W can be adjusted.

That is, by reducing the supply amount of the chemical solution, the liquid level of the chemical solution in the circulation groove 121 is lowered, and the processing width of the outer peripheral portion of the substrate W can be narrowed. Further, by increasing the supply amount of the chemical solution, the liquid level of the chemical solution in the circulation groove 121 is increased, and the processing width of the outer peripheral portion of the substrate W can be widened.

In addition, similar to the circulation grooves 121, the circulation grooves of the first modification in which a rinse solution circulates and the circulation grooves of the first modification in which a dry fluid circulates are provided with a rinse solution supply unit capable of changing the supply amount of the rinse solution, and a fluid supply unit capable of changing the supply amount of the dry fluid, respectively.

Further, the circulation grooves 121 and the circulation grooves for the rinse solution and the dry fluid may be provided with driving units capable of driving these circulation grooves in a radial direction of the substrates W, as in the first embodiment described above. In this case, the control unit 160 may appropriately adjust both the supply amounts of the chemical solution, the rinse solution, and the dry fluid to be supplied to the circulation grooves 121 and the like, and the positions of the circulation grooves 121 and the like in the radial direction with respect to the substrate W to adjust the processing width of the outer peripheral portion of the substrate W.

In the substrate processing apparatus 1a according to the first modification, the chemical solution supply unit 141 is configured to be able to change the liquid level of the chemical solution in the circulation groove 121 by adjusting the supply amount of the chemical solution. With such a configuration as well, the processing width of the outer peripheral portion of the substrate W can be adjusted.

In addition, in the substrate processing apparatus 1a according to the first modification, the same effects as those of the substrate processing apparatus 1 according to the first embodiment described above can be obtained.

Second Modification

Next, configuration examples of substrate processing apparatuses 1b and 1c according to a second modification of the first embodiment will be described with reference to FIGS. 4 and 5. The substrate processing apparatuses 1b and 1c according to the second modification differ from the above-described first embodiment in that nozzles are provided in the circulation grooves.

Figure 4:
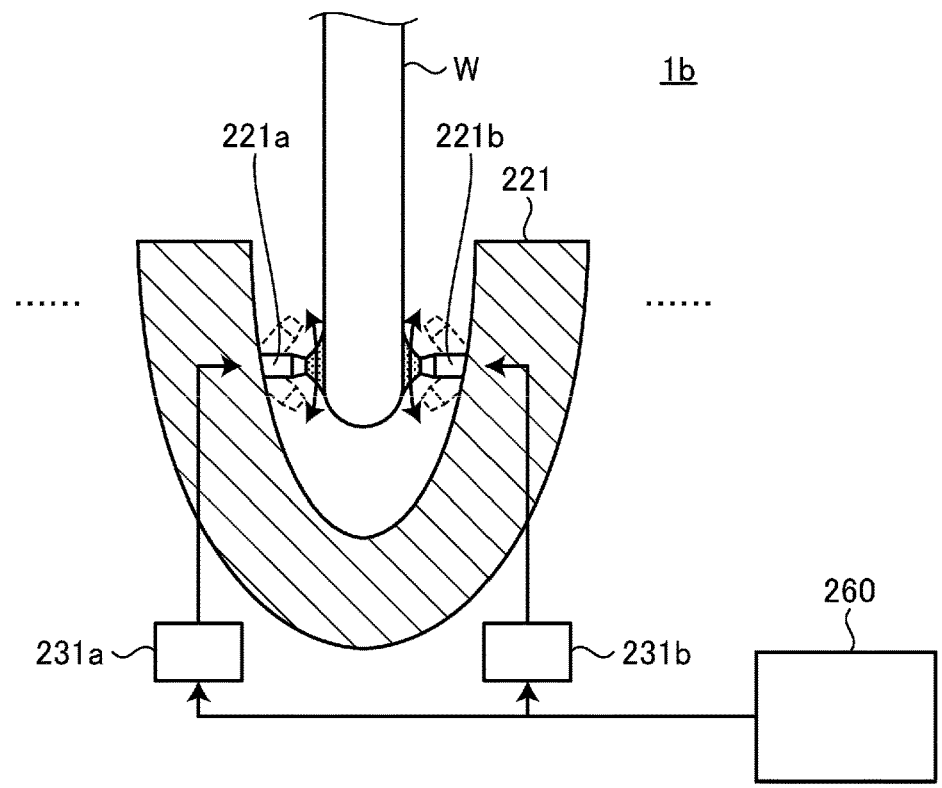
FIG. 4 is a schematic diagram showing an example of a configuration of a substrate processing apparatus according to a second modification of the first embodiment.
Figure 5:
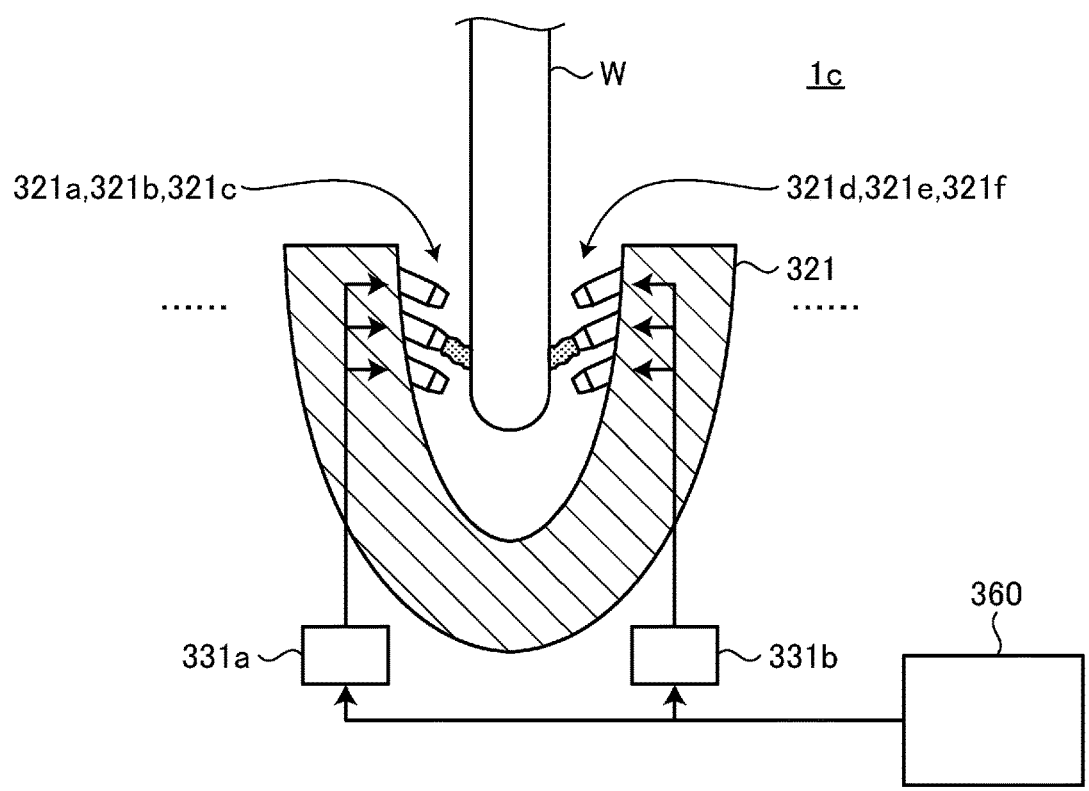
FIG. 5 is a schematic diagram showing an example of the configuration of the substrate processing apparatus according to the second modification of the first embodiment.

FIGS. 4 and 5 are schematic diagrams showing the configuration examples of the substrate processing apparatuses 1b and 1c according to the second modification of the first embodiment. FIGS. 4 and 5 show enlarged views of the circulation grooves 221 and 321 through which an outer peripheral portion of one substrate W passes. In addition, in FIGS. 4 and 5, the same reference numerals are assigned to the same components as in the above-described first embodiment, and the description thereof may be omitted.

In the example shown in FIG. 4, the substrate processing apparatus 1b according to the second modification includes a plurality of circulation grooves 221 that correspond to a plurality of substrates W respectively and are provided with chemical solution nozzles 221a and 221b supplying chemical solutions respectively. More specifically, these chemical solution nozzles 221a and 221b are provided on an inner wall surface of the circulation groove 221.

At this time, it is preferable that the chemical solution nozzles 221a and 221b are provided on the inner wall surfaces on both sides of the circulation groove 221 facing the front and rear surfaces of the substrate W, respectively. Thus, a predetermined film to be processed can be processed with the chemical solution regardless of whether the predetermined film to be processed is formed on either the front or rear surface of the substrate W or on both surfaces.

Further, these chemical solution nozzles 221a and 221b are configured such that a discharge direction of the chemical solution may be changed by, for example, driving the tip portions in a vertical direction. Further, the circulation grooves 221 are respectively provided with driving units 231a and 231b that control these chemical solution nozzles 221a and 221b, respectively.

The driving units 231a and 231b provided in the circulation groove 221 change the vertical direction of the chemical solution nozzles 221a and 221b, and change the discharge direction of the chemical solution to be circulated in the circulation groove 221, under the control of control unit 260. The control unit 260 controls the driving units 231a and 231b based on the film thickness measurement result of the film thickness meter 50, for example, to change the vertical direction of the chemical solution nozzles 221a and 221b. Thus, the processing width of the outer peripheral portion of the substrate W can be adjusted.

That is, by directing the chemical solution nozzles 221a and 221b downward, the chemical solution is discharged to an edge side of the substrate W, and the processing width of the outer peripheral portion of the substrate W can be narrowed. Further, by directing the chemical solution nozzles 221a and 221b upward, the chemical solution is discharged to the inner side of the substrate W, and the processing width of the outer peripheral portion of the substrate W can be widened.

In addition, it is preferable that the driving units 231a and 231b can control the chemical solution nozzles 221a and 221b on the front and rear surface sides of the substrate W, independently. Thus, the discharge direction of the chemical solution from the chemical solution nozzles 221a and 221b can be independently controlled to make the processing widths of the outer peripheral portions of the front and rear surfaces of the substrate W different from each other.

Further, similar to the circulation grooves 221, the circulation grooves of the second modification in which the rinse solution circulates and the circulation grooves of the second modification in which the dry fluid circulates may be provided with a rinse solution nozzle capable of discharging a rinse solution, and a fluid nozzle capable of discharging a dry fluid, respectively.

In the example shown in FIG. 5, the substrate processing apparatus 1c according to the second modification includes a plurality of circulation grooves 321 that correspond to the plurality of substrates W respectively and are provided with chemical solution nozzles 321a to 321f supplying the chemical solutions respectively. More specifically, these chemical solution nozzles 321a to 321f are provided on an inner wall surface of the circulation groove 321.

At this time, it is preferable that the chemical solution nozzles 321a to 321f are provided on inner wall surfaces on both sides of the circulation groove 321 facing the front and rear surfaces of the substrate W, respectively. In other words, the chemical solution nozzles 321a to 321c are located on the inner wall surface of the circulation groove 321 facing the one side surface of the substrate W, for example, from a top side to a bottom side. Further, the chemical solution nozzles 321d to 321f are located on the inner wall surface of the circulation groove 321 facing the other side surface of the substrate W, for example, from the top side to the bottom side.

In addition, each individual circulation groove 321 is provided with a driving unit 331a that controls the chemical solution nozzles 321a to 321c facing the one side surface of the substrate W, and a driving unit 331b that controls the chemical solution nozzles 321d to 321f facing the other side surface of the substrate W.

The driving unit 331a provided in the circulation groove 321 controls at least one of the chemical solution nozzles 321a to 321c under the control of the control unit 360 to change a discharge height of the chemical solution to be circulated in the circulation groove 321. The control unit 360 controls the driving unit 331a based on the film thickness measurement result of the film thickness meter 50, for example, to cause the chemical solution to be discharged from at least one of the chemical solution nozzles 321a to 321c. Thus, the processing width of the outer peripheral portion of the substrate W can be adjusted.

That is, by discharging the chemical solution from the chemical solution nozzle 321c provided at the lower position among the chemical solution nozzles 321a to 321c, the chemical solution is discharged to the edge side of the substrate W, and the processing width of the outer peripheral portion of the substrate W can be narrowed. Further, by discharging the chemical solution from the chemical solution nozzle 321a provided at the higher position among the chemical solution nozzles 321a to 321c, the chemical solution is discharged to the inner side of the substrate W, and the processing width of the outer peripheral portion of the substrate W can be widened.

The driving unit 331b provided in the circulation groove 321 controls at least one of the chemical solution nozzles 321d to 321f under the control of the control unit 360 to change the discharge height of the chemical solution to be circulated in the circulation groove 321. The control unit 360 controls the driving unit 331b based on the film thickness measurement result of the film thickness meter 50, for example, to cause the chemical solution to be discharged from at least one of the chemical solution nozzles 321d to 321f. Thus, the processing width of the outer peripheral portion of the substrate W can be adjusted.

In addition, similar to the circulation grooves 321, the circulation grooves of the second modification in which the rinse solution circulates and the circulation grooves of the second modification in which the dry fluid circulates may be provided with a plurality of rinse solution nozzles capable of discharging the rinse solution on the both surfaces of the substrate W, and a plurality of fluid nozzles capable of discharging the dry fluid on the both surfaces of the substrate W, respectively.

Further, the circulation grooves 221 and 321 and the circulation grooves for the rinse solution and the dry fluid may be provided with driving units capable of driving these circulation grooves in a radial direction of the substrates W, as in the first embodiment described above. In this case, the control units 260 and 360 may appropriately adjust both the chemical solution nozzles in the circulation grooves 221 and 321 and the positions of the circulation grooves 221 and 321 in the radial direction with respect to the substrate W to adjust the processing width of the outer peripheral portion of the substrate W.

In the substrate processing apparatus 1b according to the second modification, the circulation groove 221 has the chemical solution nozzles 221a and 221b provided on the inner wall of the circulation groove 221 and capable of vertically changing the discharge direction of the chemical solution. Further, in the substrate processing apparatus 1c according to the second modification, the circulation groove 321 has a plurality of chemical solution nozzles 321a to 321f located vertically on the inner wall of the circulation groove 321. With such a configuration as well, the processing width of the outer peripheral portion of the substrate W can be adjusted.

In addition, in the substrate processing apparatuses 1b and 1c according to the second modification, the same effects as those of the substrate processing apparatus 1 according to the first embodiment described above can be obtained.

Third Modification

Next, an example of a configuration of a substrate processing apparatus according to a third modification of the first embodiment will be described with reference to FIGS. 6A to 6C. The substrate processing apparatus according to the third modification differs from the first embodiment described above in shapes of circulation grooves 421a to 421c.

FIGS. 6A to 6C are schematic diagrams showing the example of the configuration of the substrate processing apparatus according to the third modification of the first embodiment. FIGS. 6A to 6C show the circulation grooves 421a to 421c through which an outer peripheral portion of one substrate W passes. In addition, in FIGS. 6A to 6C, the same reference numerals are assigned to the same components as in the above-described first embodiment, and the description thereof may be omitted.

In the example shown in FIG. 6A, the circulation groove 421a of the third modification has a U-shaped cross section. In the example shown in FIG. 6B, the circulation groove 421b of the third modification has a V-shaped cross section. In the example shown in FIG. 6C, the circulation groove 421c of the third modification has a rectangular-shaped cross section with an open upper end.

In this manner, as long as the circulation grooves 421a to 421c can circulate the chemical solution to process the outer peripheral portion of the substrate W, the circulation grooves 421a to 421c may have any shape. This is the same for the circulation grooves for circulating a rinse solution and the circulation grooves for circulating a dry fluid.

In the substrate processing apparatus according to the third modification, the same effects as those of the substrate processing apparatus 1 according to the first embodiment described above can be obtained.

Fourth Modification

Next, an example of a configuration of a substrate processing apparatus 1d according to a fourth modification of the first embodiment will be described with reference to FIG. 7. The substrate processing apparatus 1d according to the fourth modification differs from the first embodiment described above in that a circulation groove 521 shared by a plurality of substrates W is provided.

FIG. 7 is a schematic diagram showing the example of the configuration of the substrate processing apparatus 1d according to the fourth modification of the first embodiment. In addition, in FIG. 7, the same reference numerals are assigned to the same components as in the above-described first embodiment, and the description thereof may be omitted.

As shown in FIG. 7, the substrate processing apparatus 1d includes a wide circulation groove 521 in which outer peripheral portions of a plurality of substrates W located in a horizontal direction can be collectively immersed. That is, the circulation groove 521 of the fourth modification is shared among the plurality of substrates W. Further, only one chemical solution supply unit 541 that supplies a chemical solution to the circulation groove 521 is provided in the circulation groove 521, for example. The control unit 560 of the fourth modification controls the chemical solution supply unit 541 to supply the chemical solution to the circulation groove 521.

Further, in the substrate processing apparatus 1d according to the fourth modification, one circulation groove for circulating a rinse solution, one circulation groove for circulating a dry fluid, and one rinse solution supply unit and one fluid supply unit respectively provided in these circulation grooves may be provided, and may be shared among the plurality of substrates W.

These chemical solution supply unit 541, the rinse solution supply unit, and the fluid supply unit may be configured such that the supply amounts of the chemical solution, the rinse solution, and the dry fluid can be adjusted. Further, the substrate processing apparatus 1d according to the fourth modification may be provided with a driving unit that moves the circulation grooves 521 or the like in the radial direction of the plurality of substrates W, for example, as in the first embodiment.

In the substrate processing apparatus 1d according to the fourth modification, the same effects as those of the substrate processing apparatus 1 according to the first embodiment described above can be obtained.

In addition, in the first embodiment and the like described above, the rollers 11 and 12 are provided for each individual substrate W, but the rollers 11 and 12 may extend across the width of the plurality of substrates W located in the horizontal direction and may be shared among the plurality of substrates W.

Fifth Modification

Next, an example of a configuration of a substrate processing apparatus 1e according to a fifth modification of the first embodiment will be described with reference to FIG. 8. The substrate processing apparatus 1e according to the fifth modification differs from the first embodiment described above in that a plurality of circulation grooves 621a and 621b for circulating a chemical solution are provided.

Figure 8:
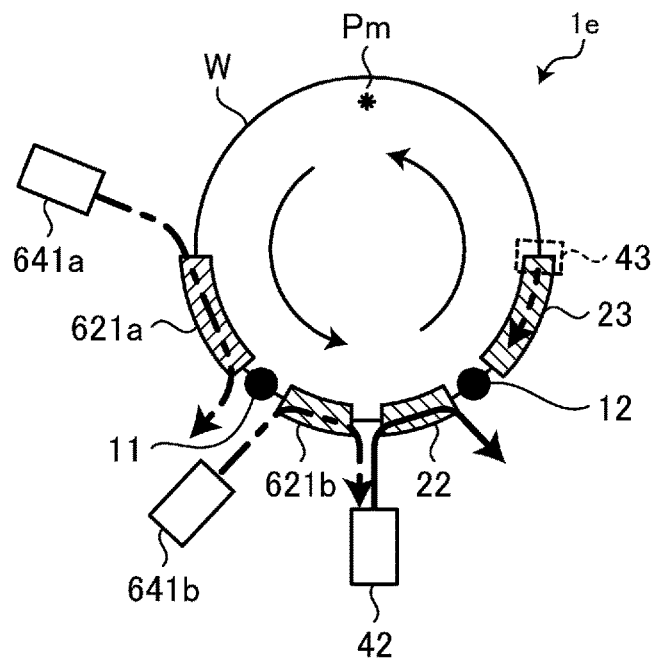
FIG. 8 is a schematic diagram showing an example of a configuration of a substrate processing apparatus according to a fifth modification of the first embodiment.

FIG. 8 is a schematic diagram showing the example of the configuration of the substrate processing apparatus 1e according to the fifth modification of the first embodiment. In addition, in FIG. 8, the same reference numerals are assigned to the same components as in the above-described first embodiment, and the description thereof may be omitted.

As shown in FIG. 8, the substrate processing apparatus 1e includes a plurality of circulation grooves 621a and 621b provided corresponding to each of a plurality of substrates W. Further, a chemical solution supply unit 631a that supplies the chemical solution is provided in the circulation groove 621a. A chemical solution supply unit 631b that supplies the chemical solution is provided in the circulation groove 621b.

In addition, FIG. 8 shows an example in which the substrate processing apparatus 1e is provided with two circulation grooves 621a and 621b provided with chemical solution supply units 641a and 641b, respectively. However, three or more circulation grooves 621 may be provided. In this manner, by increasing the number of circulation grooves 621 for circulating the chemical solution, it is possible to increase the removal speed of the predetermined film formed on the outer peripheral portion of the substrate W per rotation.

Further, a plurality of circulation grooves for circulating a rinse solution may increase the cleaning speed of the substrate W per rotation after being processed with the chemical solution, and to perform the cleaning of the substrate W more reliably. Further, a plurality of circulation grooves for circulating a dry fluid may increase the drying speed of the substrate W per rotation after cleaning, and to dry the substrate W more reliably.

Further, the supply amounts of the chemical solution, the rinse solution, and the dry fluid to be supplied by the chemical solution supply units 641a and 641b, the rinse solution supply unit, and the fluid supply unit provided in these circulation grooves 621a, 621b, and the like may be adjusted. Further, the substrate processing apparatus 1e according to the fifth modification may be provided with a driving unit that moves the circulation grooves 621a, 621b, or the like in the radial direction of the plurality of substrates W, for example, as in the first embodiment.

In the substrate processing apparatus 1e according to the fifth modification, one substrate W is provided with a plurality of circulation grooves 621a and 621b. Thus, the processing speed of the substrate W per rotation can be increased.

In addition, in the substrate processing apparatus 1e according to the fifth modification, the same effects as those of the substrate processing apparatus 1 according to the first embodiment described above can be obtained.

Second Embodiment

Hereinafter, a second embodiment will be described in detail with reference to the drawings. The second embodiment differs from the first embodiment in that the substrate processing apparatus has a single-wafer configuration.

In the above-described first embodiment and the like, since the substrate W is processed while being vertically erected, the batch-type substrate processing apparatus 1 is configured. However, in a case where, for example, a more precise removal process of a predetermined film is required, the single-wafer configuration may be adopted and a film thickness of each substrate W may be measured.

An example of a substrate processing apparatus adopting a single-wafer configuration will be described below.

Figure 9A:
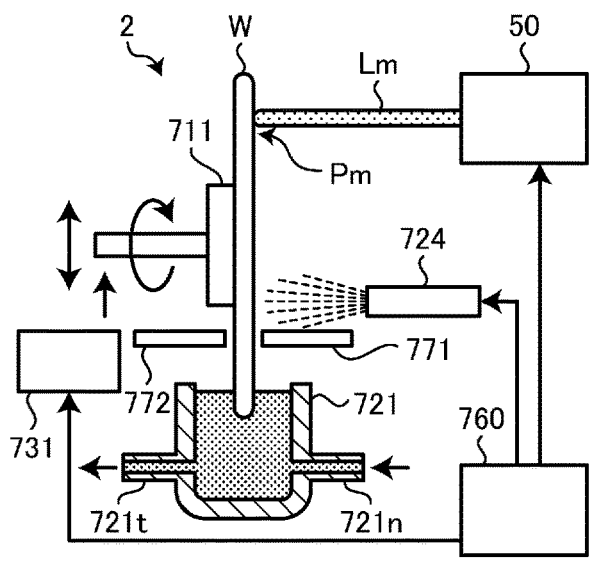
FIGS. 9A to 9D are schematic diagrams showing an example of a configuration of a substrate processing apparatus according to a second embodiment.
Figure 9B:
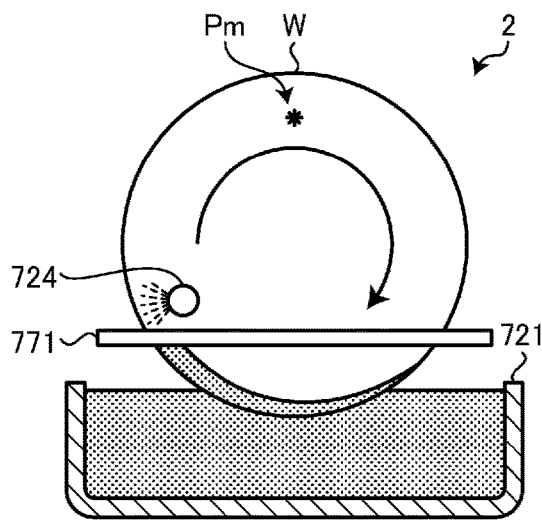
Figure 9C:
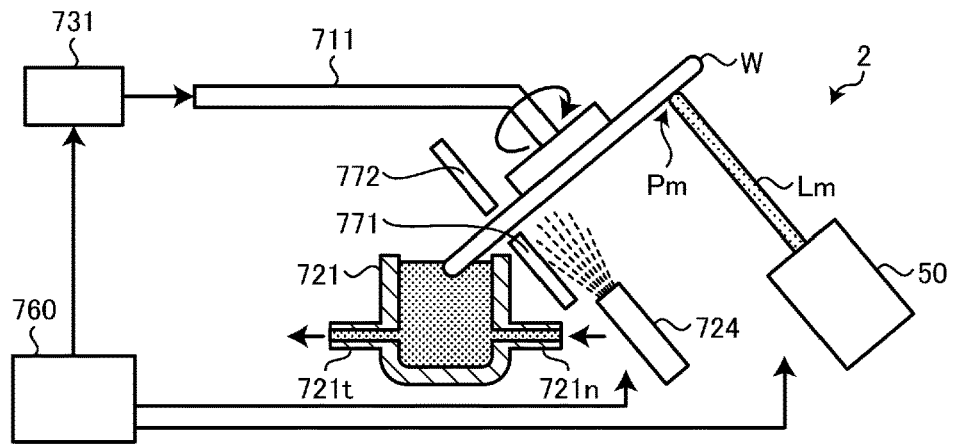
Figure 9D:
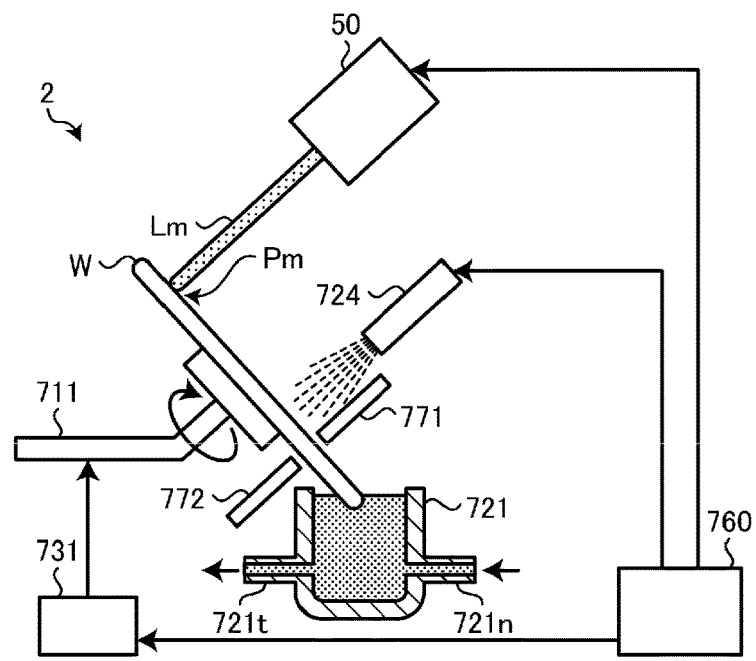

FIGS. 9A to 9D are schematic diagrams showing an example of a configuration of a substrate processing apparatus 2 according to the second embodiment. FIG. 9A is a side view of an inside of the processing chamber of the substrate processing apparatus 2, and FIG. 9B is a front view of the inside of the processing chamber of the substrate processing apparatus 2. FIGS. 9C and 9D are side views of the inside of the processing chamber of the substrate processing apparatus 2 that holds the substrate W tilted.

In addition, in FIGS. 9A to 9D, the same reference numerals are assigned to the same components as in the above-described first embodiment, and the description thereof will be omitted.

As shown in FIGS. 9A and 9B, the substrate processing apparatus 2 according to the second embodiment includes a holding unit 711, a chemical solution tank 721, a nozzle 724, a driving unit 731, shielding plates 771 and 772, a film thickness meter 50, and a control unit 760.

The holding unit 711 sucks and supports a rear surface of the substrate W, and holds the substrate W while being vertically erected. The rear surface of the substrate W is a surface opposite to a front surface on which the semiconductor device is provided. Further, the holding unit 711 is configured so that the held substrate W may be vertically moved and can be rotated in the circumferential direction. The rotation speed of the substrate W may be, for example, 1,000 rpm.

The holding unit 711 is provided with a driving unit 731 that vertically moves and rotates the holding unit 711, and a pump (not shown) that sucks the substrate W by the holding unit 711.

On the lower side of the substrate W held by the holding unit 711, the chemical solution tank 721 is provided in which a chemical solution for removing a predetermined film (not shown) of the substrate W is stored. The chemical solution tank 721 has, for example, an inlet 721n through which the chemical solution flows in on one side of the side surfaces facing each other, and an outlet 721t through which the chemical solution flows out on the other side.

While the substrate W is being processed, the chemical solution flows from the inlet 721n into the chemical solution tank 721 by a pump (not shown) and is discharged from the outlet 721t. Thus, the chemical solution flows in the chemical solution tank 721, and the removal speed of the predetermined film on the substrate W increases. In addition, the chemical solution discharged from the outlet 721t may be circulated again from the inlet 721n to the chemical solution tank 721 and used repeatedly.

The shielding plates 771 and 772 are provided around the substrate W above the chemical solution tank 721. The shielding plates 771 and 772 are provided on one surface side and the other surface side of the substrate W, respectively, with a very slight gap from these surfaces. This prevents the chemical solution stored in the chemical solution tank 721 from splashing to the upper side of the substrate W. In addition, the shielding plates 771 and 772 may be integrally formed with a slit into which the substrate W is inserted in the center.

A nozzle 724 is provided in the vicinity of the front surface of the substrate W above the shielding plates 771 and 772 and downstream in the rotation direction of the substrate W with respect to the chemical solution tank 721. The nozzle 724 is connected to a rinse solution supply source and a dry fluid supply source (not shown), and appropriately sprays a rinse solution and a dry fluid from these supply sources onto an outer peripheral portion of the substrate W after chemical solution processing.

In addition, the angle of the nozzle 724 with respect to the substrate W is preferably adjusted such that the rinse solution and the dry fluid are sprayed from the inside to the outside of the substrate W. By adjusting the spray direction of the rinse solution and the dry fluid in this manner, the chemical solution, the rinse solution, and the like is prevented from spreading to the inside of the substrate W.

As described above, the nozzle 724 cleans and dries the outer peripheral portion of the substrate W after the chemical solution processing. At this time, a nozzle 724 for spraying the rinse solution and the dry fluid may be provided on a rear surface side of the substrate W. Thus, it is possible to clean and dry the outer peripheral portion of the rear surface side of the substrate W as well.

The film thickness meter 50 irradiates the measurement point Pm on the upper side of the substrate W with electromagnetic waves Lm such as X-rays, and measures the film thickness of the predetermined film formed on the outer peripheral portion of the substrate W. In the substrate processing apparatus 2 according to the second embodiment, the film thickness meter 50 measures the film thickness at any position on the outer peripheral portion of the substrate W passing between the downstream side of the nozzle 724 and the upstream end of the chemical solution tank 721.

During this time, the outer peripheral portion of the substrate W is in a dry state, and the film thickness of the predetermined film can be measured with high precision without being disturbed by droplets of the chemical solution or the rinse solution. In other words, the substrate W only needs to be in a dry state so that the film thickness meter 50 can obtain sufficient measurement accuracy.

In addition, when a predetermined film on the rear surface side of the substrate W is to be processed, or when the predetermined film on the rear surface side requires more precise processing, the film thickness meter 50 may be provided at a position facing the rear surface side of the substrate W and capable of measuring the thickness of the predetermined film on the rear surface side.

The control unit 760 controls each unit of the substrate processing apparatus 2, such as the holding unit 711, the nozzle 724, the driving unit 731, the shielding plates 771 and 772, the film thickness meter 50, and various pumps (not shown). At this time, similar to the control unit 60 of Embodiment 1 described above, the control unit 760 controls each part of the substrate processing apparatus 2 to perform desired chemical solution processing, by detecting the processing time with the chemical solution or the end point of the chemical solution processing by various methods, based on the measurement result of the film thickness meter 50, and controlling the amount of sinking of the substrate W into the chemical solution by the holding unit 711.

In addition, in the substrate processing apparatus 2 according to the second embodiment, a small amount of the chemical solution or the rinse solution may remain on the substrate W, when the processing of the substrate W is ended. In this case, as described in the first embodiment, these processes can be completed by another cleaning device or the like.

As shown in FIGS. 9C and 9D, the substrate processing apparatus 2 according to the second embodiment can hold the substrate W not only vertically, but also tilted.

That is, as shown in FIG. 9C, the driving unit 731 can adjust the holding angle of the substrate W by the holding unit 711 under the control of the control unit 760, for example, and hold the substrate W in a state in which the substrate W is tilted to a front surface side from a vertical state. By tilting the substrate W such that the front surface side faces slightly downward, for example, the processing width of the outer peripheral portion on the front surface side can be made wider than that on the rear surface side. Further, it is possible to prevent the chemical solution from flowing into the rear surface side.

In this manner, when the main surface to be processed is on the front surface side of the substrate W, it is possible to process the substrate W with the chemical solution while being tilted toward the front surface side.

Further, as shown in FIG. 9D, the driving unit 731 can adjust the holding angle of the substrate W by the holding unit 711 under the control of the control unit 760, for example, and hold the substrate W in a state in which the substrate W is tilted to the rear surface side from the vertical state. By tilting the substrate W such that the rear surface side faces slightly downward, for example, the processing width of the outer peripheral portion on the rear surface side can be made wider than that on the front surface side. Further, it is possible to prevent the chemical solution from flowing into the front surface side.

In this manner, when the main surface to be processed is the rear surface of the substrate W, it is possible to process the substrate W with the chemical solution while being tilted toward the rear surface side.

In the above configuration, the control unit 760 can control the driving unit 731 to adjust the holding angle of the substrate W by the holding unit 711, based on the film thickness measurement result of the predetermined film by the film thickness meter 50, for example.

In the substrate processing apparatus 2 according to the second embodiment, the substrate W, of which the rear surface is held, is rotated in the circumferential direction such that the surface direction of the substrate W having the predetermined film formed on the outer peripheral portion intersects the horizontal direction, one end side of the substrate W is immersed in the chemical solution tank 721 in which the chemical solution is stored, and the nozzle 724 supplies the rinse solution and the fluid for drying the rinse solution to the outer peripheral portion of the substrate W downstream of the chemical solution tank 721.

Thus, the installation area of the substrate processing apparatus 2 can be reduced. Further, for example, the removal of a predetermined film with a chemical solution and the cleaning and drying of the outer peripheral portion of the substrate W can be performed collectively, so that the productivity of the substrate processing apparatus 2 can be improved.

In the substrate processing apparatus 2 according to the second embodiment, the film thickness of the predetermined film on the outer peripheral portion of the substrate W is measured by the film thickness meter 50 on the downstream side of the nozzle 724. In this manner, by processing the substrate W while being vertically erected, it is possible to measure the film thickness of the predetermined film in the dry area of the substrate W, so that the film thickness data can be obtained with high accuracy.

Therefore, it is possible to determine the processing time using the chemical solution based on the film thickness of the predetermined film, to reduce the excess processing time, and to improve the productivity of the substrate processing apparatus 1. Further, the consumption amount of the chemical solution can be reduced.

In the substrate processing apparatus 2 according to the second embodiment, the holding unit 711 is configured to hold the substrate W, in a state in which the substrate W is tilted to the rear surface side from the vertical state, and in a state in which the substrate W is tilted to the front surface side from the vertical state. Thus, substrate processing may be performed with the front surface side or the rear surface side of the substrate W as the main surface to be processed. Further, it is possible to prevent the chemical solution from flowing into the surface on the opposite side to the direction in which the substrate W is tilted.

In the substrate processing apparatus 2 according to the second embodiment, the chemical solution tank 721 has the inlet 721n where the chemical solution flows in, and the outlet 721t where the chemical solution flows out. Thus, the chemical solution may be circulated in the chemical solution tank 721, and the removal speed of the predetermined film on the substrate W can be increased.

In addition, in the substrate processing apparatus 2 according to the second embodiment, the same effects as those of the substrate processing apparatus 1 according to the first embodiment described above can be obtained.

First Modification

Next, a substrate processing apparatus according to a first modification of the second embodiment will be described with reference to FIG. 10. The substrate processing apparatus according to the first modification differs from the second embodiment described above in that a suction nozzle 725 is provided.

Figure 10:
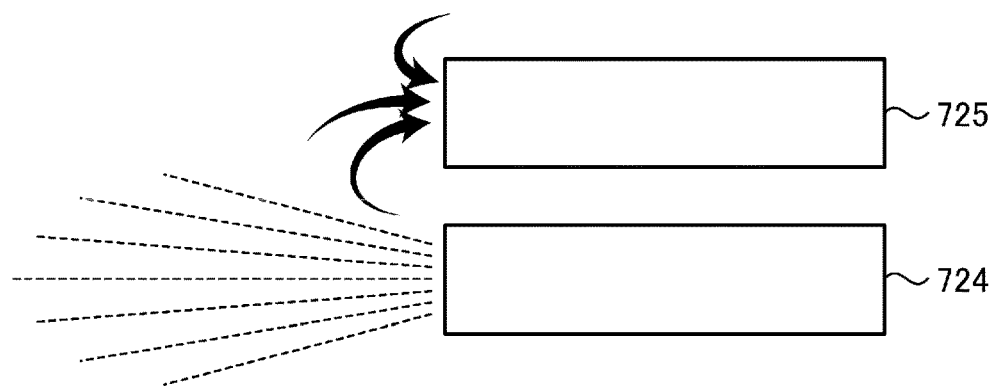
FIG. 10 is a schematic diagram illustrating an example of a configuration of a nozzle and a suction nozzle in a substrate processing apparatus according to a first modification of the second embodiment.

FIG. 10 is a schematic diagram illustrating an example of a configuration of a nozzle 724 and a suction nozzle 725 in the substrate processing apparatus according to the first modification of the second embodiment. In addition, in FIG. 10, the same reference numerals are assigned to the same components as in the above-described second embodiment, and the description thereof will be omitted.

As shown in FIG. 10, the substrate processing apparatus according to the first modification includes the suction nozzle 725 in the vicinity of the nozzle 724 for spraying the substrate W with the rinse solution and the dry fluid. The suction nozzle 725 is connected to, for example, a pump (not shown), and sucks the rinse solution and dry fluid sprayed onto the substrate W from the nozzle 724 and excess rinse solution and dry fluid discharged from the nozzle 724.

In the substrate processing apparatus according to the first modification, the suction nozzle 725 for sucking the rinse solution and the dry fluid is provided. Thus, the used or excess rinse solution and dry fluid can be sucked, and the substrate W can be cleaned and dried quickly.

In addition, in the substrate processing apparatus according to the first modification, the same effects as those of the substrate processing apparatus 2 according to the second embodiment described above can be obtained.

Second Modification

Next, a substrate processing apparatus according to a second modification of the second embodiment will be described with reference to FIGS. 11A and 11B. The substrate processing apparatus according to the second modification differs from the above-described second embodiment in that contact-type nozzles 824a and 824b are provided.

Figure 11A:
FIGS. 11A and 11B are schematic diagrams illustrating an example of a configuration of a nozzle in a substrate processing apparatus according to a second modification of the second embodiment.
Figure 11B:
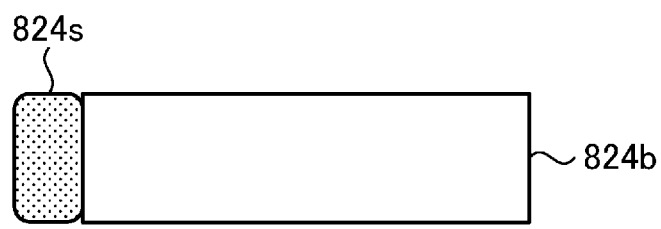

FIGS. 11A and 11B are schematic diagrams illustrating an example of a configuration of nozzles 824a and 824b in the substrate processing apparatus according to the second modification of the second embodiment. In addition, in FIGS. 11A and 11B, the same reference numerals are assigned to the same components as in the above-described the second embodiment, and the description thereof will be omitted.

In the example shown in FIG. 11A, the substrate processing apparatus according to the second modification includes a nozzle 824a having a plurality of needle-like members 824n at a tip. Such a nozzle 824a can be obtained by forming the tip of the nozzle 824a into a needle shape having a fine diameter of, for example, 1 mm or less. These needle-like members 824n are preferably made of a flexible material.

In the substrate processing apparatus according to the second modification, the nozzle 824a appropriately sprays the rinse solution and the dry fluid from the needle-like members 824n while the needle-like members 824n at the tip are in contact with the bevel of the substrate W. Thus, the rinse solution and the dry fluid are supplied from the bevel of the substrate W to the outer peripheral portion of the substrate W, and the outer peripheral portion of the substrate W is cleaned and dried.

In this manner, since the substrate W is processed while the needle-like members 824n are in direct contact with the substrate W, the cleaning speed and the drying speed of the substrate W are improved. Further, as described above, since the needle-like members 824n have flexibility, the substrate W is prevented from being damaged when the needle-like members 824n come into contact with the substrate W.

In the example shown in FIG. 11B, the substrate processing apparatus according to the second modification includes a nozzle 824b having a sponge-like member 824s at a tip. Such a nozzle 824b is obtained by providing, for example, sponge-shaped resin or the like at the tip of the nozzle 824b.

In the substrate processing apparatus according to the second modification, the nozzle 824b appropriately infiltrates the sponge-like member 824s with the rinse solution and the dry fluid while the sponge-like member 824s at the tip is in contact with the bevel of the substrate W. Thus, the rinse solution and the dry fluid are leached from the sponge-like member 824s and supplied to the outer peripheral portion of the substrate W, so that the outer peripheral portion of the substrate W is cleaned and dried.

In this manner, since the substrate W is processed while the needle-like members 824n are in direct contact with the substrate W, the cleaning speed and the drying speed of the substrate W are improved. Further, since the sponge-like member 824s is provided at the tip, the substrate W is prevented from being damaged when the sponge-like member 824s comes into contact with the substrate W.

In the substrate processing apparatus according to the second modification, the nozzles 824a and 824b have the needle-like members 824n or the sponge-like member 824s that come into contact with the substrate W at their tips. Thus, the substrate W can be cleaned and dried quickly.

In addition, in the substrate processing apparatus according to the second modification, the same effects as those of the substrate processing apparatus 2 according to the second embodiment described above can be obtained.

Third Modification

Next, a substrate processing apparatus 2c according to a third modification of the second embodiment will be described with reference to FIGS. 12A and 12B. The substrate processing apparatus 2c according to the third modification differs from the second embodiment above described in that a plurality of nozzles are provided.

Figure 12A:
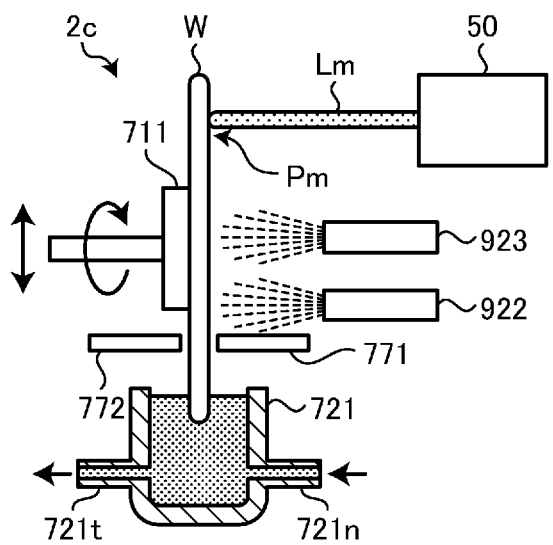
FIGS. 12A and 12B are schematic diagrams illustrating an example of a configuration of a plurality of nozzles in a substrate processing apparatus according to a third modification of the second embodiment.
Figure 12B:
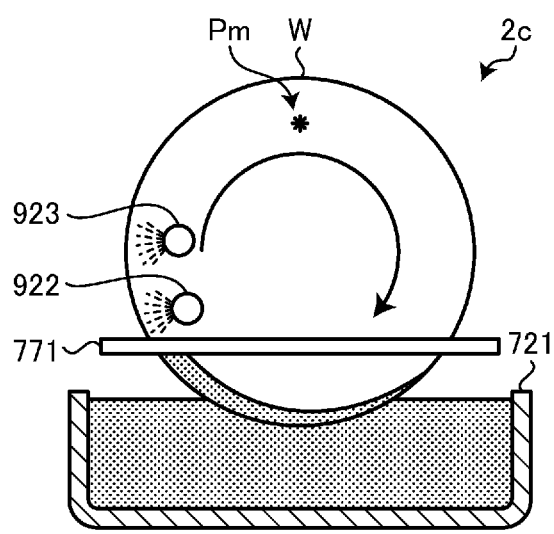

FIGS. 12A and 12B are schematic diagrams illustrating an example of a configuration of a plurality of nozzles in the substrate processing apparatus 2c according to the third modification of the second embodiment. FIG. 12A is a side view of an inside of the processing chamber of the substrate processing apparatus 2c, and FIG. 12B is a front view of the inside of the processing chamber of the substrate processing apparatus 2c. In addition, in FIGS. 12A and 12B, the same reference numerals are assigned to the same components as in the above-described Embodiment 2, and the description thereof will be omitted.

As shown in FIGS. 12A and 12B, the substrate processing apparatus 2c according to the third modification includes a rinse solution nozzle 922 and a fluid nozzle 923 for independently spraying the rinse solution and the dry fluid onto the substrate W, respectively. Further, in addition to the nozzles, the suction nozzle 725 of the first modification described above may be provided in the vicinity of the nozzles. Alternatively, the suction nozzles 725 described above may be provided adjacent to the individual rinse solution nozzles 922 and fluid nozzles 923, respectively.

In the substrate processing apparatus 2c according to the third modification, the nozzles provided in the substrate processing apparatus 2c include the rinse solution nozzle 922 that supplies the rinse solution to the outer peripheral portion of the substrate W, and the dry fluid nozzle 923 that supplies the dry fluid to the outer peripheral portion of the substrate W. In this manner, the rinse solution nozzle 922 and the fluid nozzle 923 are made independent of each other, so that the substrate W can be cleaned and dried more precisely.

In addition, the substrate processing apparatus 2c according to the third modification may be provided with a chemical solution nozzle for spraying the chemical solution onto the substrate W, instead of the chemical solution tank 721. Further, a suction nozzle for sucking the chemical solution may be further provided in the vicinity of the chemical solution nozzle. Thus, the chemical solution tank 721 can be eliminated, and the substrate processing apparatus 2c can be configured more compactly.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A substrate processing apparatus comprising:
    a holding unit configured to hold a rear surface of a substrate having a film formed on an outer peripheral portion such that a surface direction of the substrate intersects a horizontal direction, and rotate the substrate in a circumferential direction;
    a chemical solution tank configured to store a chemical solution for removing the film, with one end of the substrate being immersed;
    a nozzle configured to supply a rinse solution and a fluid for drying the rinse solution to the outer peripheral portion of the substrate, on a downstream side of the chemical solution tank; and
    a film thickness meter configured to measure a film thickness of the film on the outer peripheral portion of the substrate, on a downstream side of the nozzle.

2. The substrate processing apparatus according to claim 1, further comprising:
    a controller configured to control the holding unit, the nozzle, and the film thickness meter, wherein
    the controller configured to determine a timing of ending the immersion of the substrate in the chemical solution, based on a measurement result of the film thickness of the film from the film thickness meter.

3. The substrate processing apparatus according to claim 2, wherein
    the holding unit is configured to change a position of the substrate in a radial direction, and
    the controller is configured to adjusts an amount of sinking of the substrate into the chemical solution, by changing the position of the substrate in the radial direction by the holding unit, based on the measurement result.

4. The substrate processing apparatus according to claim 2, wherein
    the holding unit is configured to hold the substrate, in a state in which the substrate is tilted to a rear surface side from a vertical state, and in a state in which the substrate is tilted to a front surface side from the vertical state.

5. The substrate processing apparatus according to claim 4, wherein
    the controller is configured to adjust an amount of sinking of the substrate into the chemical solution, by changing the angle of the substrate in the surface direction by the holding unit, based on the measurement result.

* * * * *